United States Patent [19]
Carruthers

[11] Patent Number: 5,459,332
[45] Date of Patent: Oct. 17, 1995

[54] SEMICONDUCTOR PHOTODETECTOR DEVICE

[75] Inventor: Thomas F. Carruthers, Laurel, Md.

[73] Assignee: The United States of America as represented by the Secretary of the Navy, Washington, D.C.

[21] Appl. No.: 221,330

[22] Filed: Mar. 31, 1994

[51] Int. Cl.$^6$ ..................................................... H01L 27/14
[52] U.S. Cl. .............................. 257/17; 257/21; 257/22; 257/184
[58] Field of Search .................................. 257/21, 22, 17, 257/184, 185, 187, 188

[56] References Cited

U.S. PATENT DOCUMENTS

| | | | |
|---|---|---|---|
| 3,757,123 | 9/1973 | Archer et al. | 250/338 |
| 4,471,370 | 9/1984 | Chen et al. | 357/30 |
| 4,985,742 | 1/1991 | Pankove | 357/34 |
| 5,079,501 | 1/1992 | Esaki et al. | 257/21 X |
| 5,101,254 | 3/1992 | Hamana | 357/30 |
| 5,140,381 | 8/1992 | Badoz et al. | 357/4 |
| 5,321,275 | 6/1994 | Shimizu et al. | 257/21 |
| 5,329,136 | 7/1994 | Gossen | 257/21 X |

OTHER PUBLICATIONS

Goswami et al., "Temporal Response Characteristics of a $IN_{0.53}Ga_{0.47}As/InP$ Quantum Well Phototransistor," IEEE Transactions on Electron Devices, vol. 40, No. 11, Nov. 1993, pp. 1970–1976.

Wey et al., "Ultrafast graded double-heterostructure GaInAs/InP photodiode", Appl. Phys. Lett., vol. 58(19), 13 May 1991, pp. 2156–2158.

Liu et al., "Multicolor voltage-Tunable Quantum-Well Infrared Photodetector", IEEE Electron Devices Letters, vol. 14, No. 2, Dec. 1993, pp. 566–568.

*Primary Examiner*—William Mintel
*Attorney, Agent, or Firm*—Thomas E. McDonnell; Daniel Kalish

[57] ABSTRACT

A semiconductor photodetector employs a multilayer structure for controlling speed, efficiency and noise. A light-absorbing low band gap semiconductor emitter layer produces photogenerated charge upon absorption of light. A semiconductor collector layer collects the photogenerated charge. A semiconductor barrier layer between the light absorbing layer and the collector layer selectively blocks substantially all but photogenerated charge. A base layer may be optionally employed between the barrier layer and the collector layer for gating the current flow and controlling wavelength sensitivity.

32 Claims, 3 Drawing Sheets

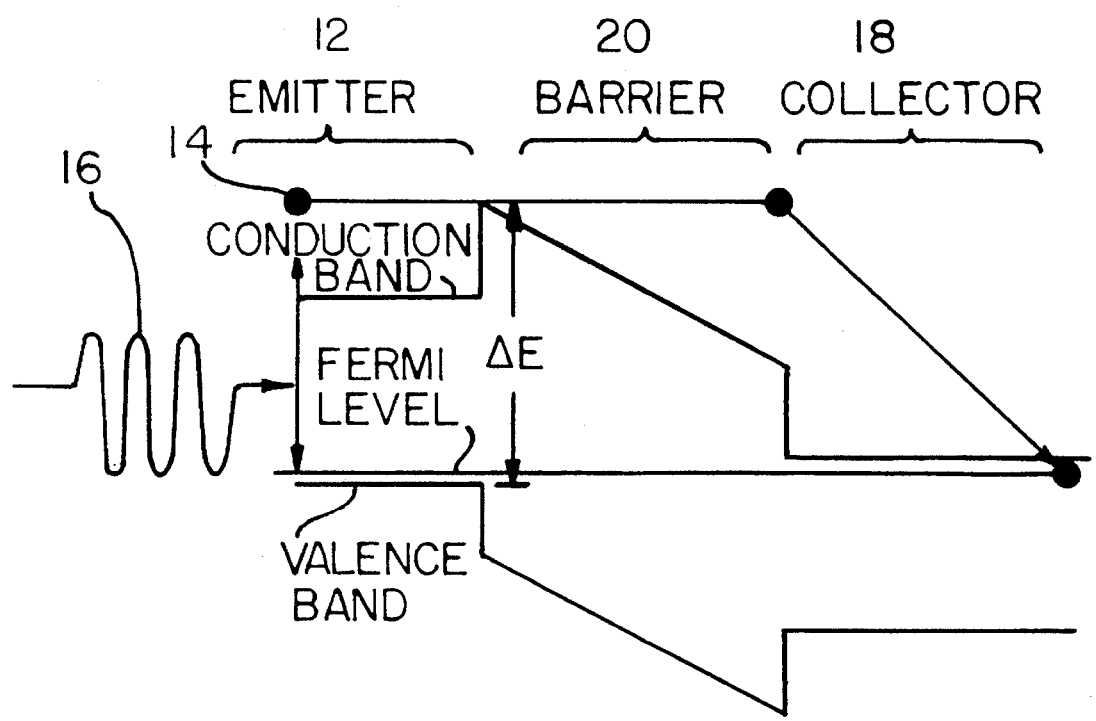

SEMICONDUCTOR PHOTODETECTOR DEVICE

BACKGROUND OF THE INVENTION

This invention pertains to photodetectors. In particular, the invention pertains to a high speed, efficient, low noise semiconductor photodetector employing a multilayer structure which allows for the separate characterization of device speed, efficiency and noise suppression in the various layers.

The highest-speed currently available semiconductor photodetectors are thin p-i-n photodiodes, where the (i) region is an intermediate undoped region which usually functions as the active photodetecting layer. The characteristics of this layer are such that it must be thin enough so that the transit of photogenerated carriers is fast. Also, the band gap of the layer must be sufficiently low so that photogenerated carriers are efficiently generated within the layer, but the band gap must be high enough so that thermally generated carriers do not produce an unacceptably high dark current. In currently available systems, one or more of these features (speed, efficiency, noise reduction) may be compromised in order to enhance some other feature.

For example, known Schottky barrier devices, such as Badoz et al., U.S. Pat. No. 5,140,381 and Archer, U.S. Pat. No. 3,757,123, have been employed in photodetectors. However, these devices include at least one metallic layer. The metal layer reduces the speed of such devices. Operation of these devices is limited to the infrared region.

Some devices, such as Hamana, U.S. Pat. No. 5,101,254, employ a valence band which has a notch for trapping minority carriers (e.g., holes). It is undesirable to trap holes in the transport region, because the holes attract majority carriers (e.g., electrons) and various device characteristics, including device speed are affected.

Some systems, e.g., Chen, U.S. Pat. No. 4,471,370, endeavor to increase the response time or speed of the device by depleting minority carriers from all the layers. Minority carriers (holes in this case) are less mobile than majority carriers (electrons in this case). Hence, the device is faster. Chen has a 600 picosecond (psec) fall time which limits its operation to about 1.7 GHz ($10^9$ Hertz).

Some devices are operative only with highly restrictive materials constraints. For example, Pankove, U.S. Pat. No. 4,985,742, is limited to structures in which at least one layer is gallium nitride. Furthermore, Pankove requires that minority carriers be trapped thereby increasing electron current.

The present invention is related to real-space electron transfer devices. In such a device, carriers gain enough energy from an applied electric field to be able to pass over an energy barrier into another region of the device. Carriers in the present invention gain energy from incident light and are able to pass over a barrier region to a collector. There appear to be no other photodetectors wherein the excess energy of the carriers over the band gap of a barrier layer is supplied by the incident light.

Prior photoconductor devices are slow or inefficient or noisy. They are often quite complicated or limited in wavelength range, and the best available photodetectors are expensive. A currently available photodetector device employs dielectric mirrors on each side of a photodiode to reflect light internally. This device is difficult to fabricate and is, consequently, extremely expensive.

Currently available prior art devices have relatively low efficiencies in a range of about 25–50%. While efficiencies up to about 90% may be achieved at great expense, the frequency response of such devices is often limited. In general, the bandwidth of currently available devices extends to a maximum of about 100 GHz.

SUMMARY OF THE INVENTION

It is an object of the present invention to provide a high speed, efficient, low noise multilayer semiconductor photodetector device.

It is another object of the present invention to provide a high speed, efficient, low noise multilayer semiconductor photodetector device employing a multilayer structure which allows for the separate characterization of device speed, efficiency and noise suppression in the various layers.

These and other objectives are achieved by a relatively thin, multilayer structure that optimizes features of low noise, high speed and efficient photodetection separately in separate layers so as to individually optimize device characteristics.

In a particular embodiment, an optical detector according to the invention comprises a relatively thin, light absorbing low band gap semiconductor emitter layer producing charge generated by light of the desired wavelength; a semiconductor collector layer for collecting the photogenerated charge; and a semiconductor barrier layer disposed between the light absorbing layer and the collector layer for blocking substantially all but the photogenerated charge to the collector.

In the present invention, the low band gap emitter is effective to absorb broad band light at relatively high efficiency, for example, at least 90 percent, and operate at relatively high bandwidth or speed, for example, 200 GHz.

In an alternative embodiment to the invention, a base layer is provided between the barrier layer and the collector layer. The base layer may be biased for regulating or gating the current flow between the emitter and the collector. The device may thus operate as a wavelength selective device.

BRIEF DESCRIPTION OF THE DRAWINGS

FIG. 2A is an energy diagram of an unbiased, two terminal device similar to FIG. 1;

DETAILED DESCRIPTION OF THE PREFERRED EMBODIMENT

The present invention is directed to a fast, efficient, low noise multilayer semiconductor photodetector. One exemplary embodiment is an electrically biased three layer, two terminal device 10 illustrated in FIG. 1. A band structure or energy diagram of the device 10 is illustrated in FIG. 2.

Figure 1:
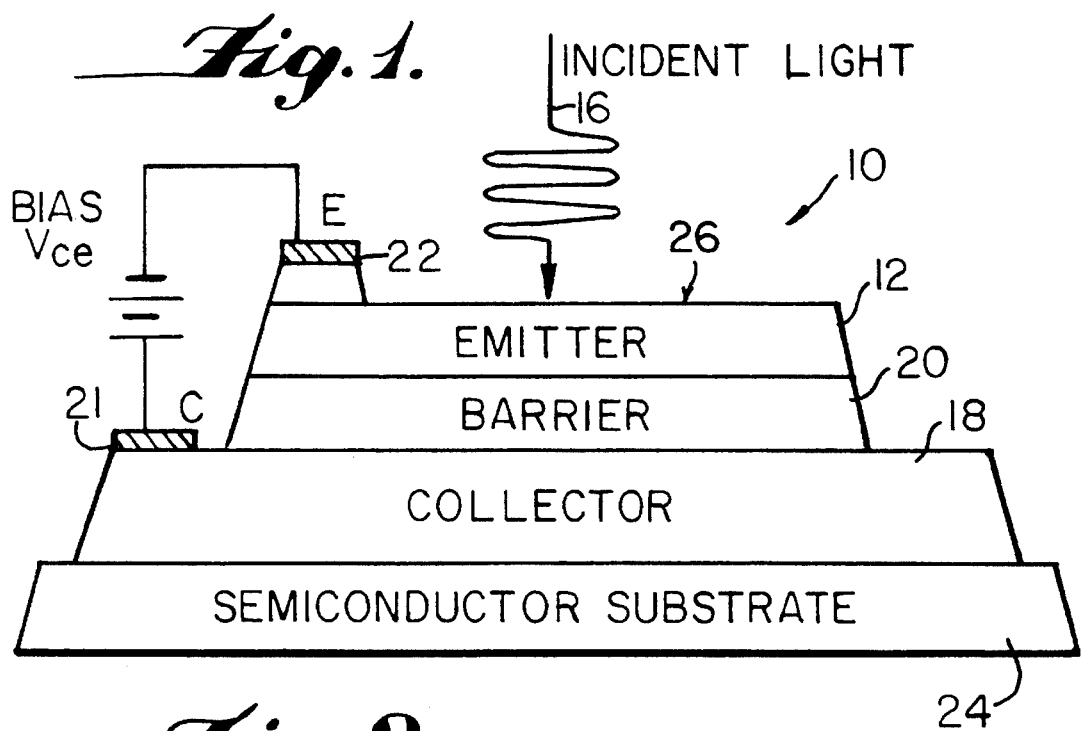
FIG. 1 is a schematic cross-sectional illustration of a two terminal device in accordance with the present invention.
Figure 2:
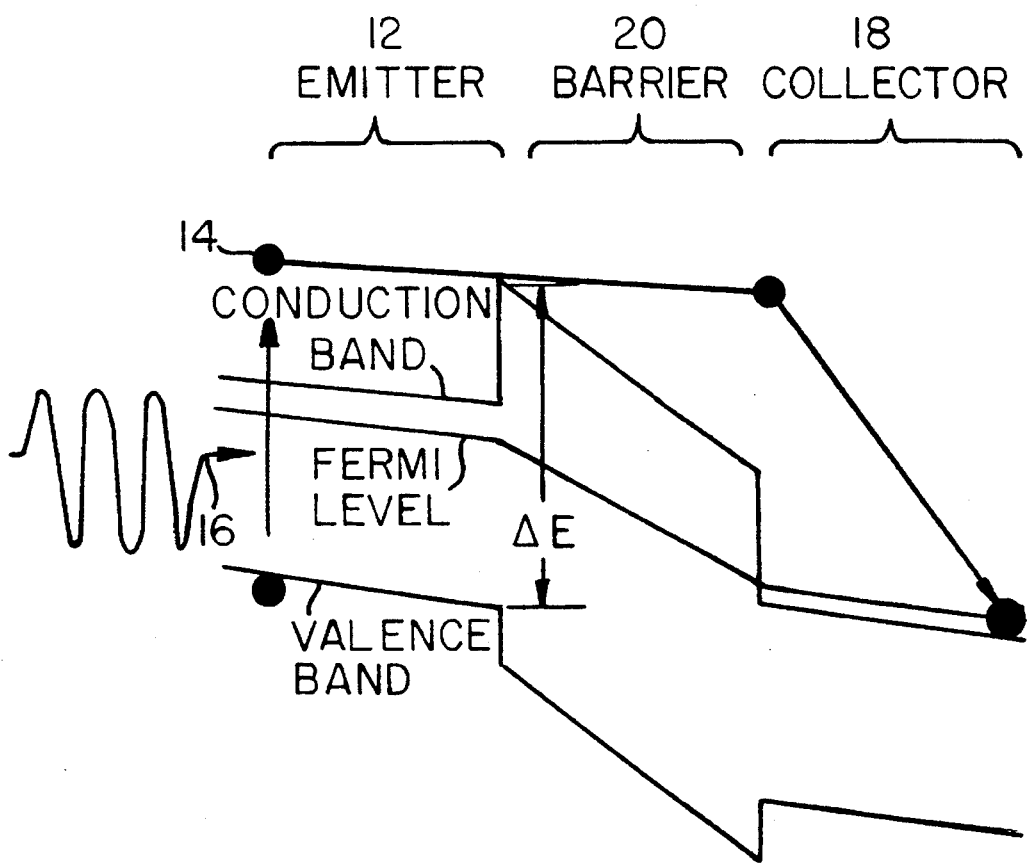
FIG. 2 is an energy diagram illustrating the energy levels of each of the relevant layers of the biased device shown in FIG. 1.

Referring now to FIG. 1, the device 10 comprises a relatively low band gap semiconductor emitter layer or emitter 12 for producing photogenerated or photoexcited charge carriers, e.g., electrons 14, upon absorption of incident light 16. A semiconductor collector layer or collector 18 for receiving the charge carriers 14 is spaced from the emitter 12. A semiconductor barrier layer or barrier 20 is disposed between the emitter 12 and the collector 18 for blocking substantially all but sufficiently energetic charge carriers 14 to the collector 18. As illustrated in FIG. 1, a bias voltage $V_{ce}$ is preferably established between the emitter 12 and the collector 18 to complete the circuit and to collect the electrons 14 at the collector 18. An electrical bias is not always necessary and it may be avoided with certain constructions described hereinafter. Typically, the device is mounted or supported on a semiconductor substrate 24.

The incident light 16 may be thought of as a stream of photons which is absorbed by the emitter layer 12. In accordance with the known photoelectric effect, the energy of the photons is quantified in hv packets where $v=c/\lambda$. The event of interest is absorption so that the entire energy hv of the absorbed photon is transferred to an electron 14, resulting in a photoexcited electron 14. If the absorbed energy hv exceeds the binding energy or band gap of the emitter material, the photoexcited electron 14 migrates with a kinetic energy proportional to the excess of the photon energy hv above the emitter band gap. If the electron 14 receives sufficient energy it can migrate from the emitter 12 through the barrier 20 to the collector 18 where the collected charge is measured as an output.

The emitter 12 is a low band gap material. Such a material has the desirable property of possessing a high absorption coefficient for photons of energy substantially greater than the bandgap of emitter 12. The material also tends to allow high electron mobility. In the present invention, the emitter 12 is a semiconductor material whose direct valence-to-conduction band energy is substantially less than the photon energy hv of the incident light 16 to be detected. Its absorption coefficient ideally approaches $10^5$ inverse centimeters ($cm^{-1}$). Thus, the electrons are efficiently produced in a thin emitter layer 12 and migrate easily.

Referring now to FIG. 2, the light 16 is absorbed by the electron 14 causing its energy to jump by an amount hv. If hv is greater than the energy difference $\Delta E$ between the valence band of the emitter 12 and the conduction band of the barrier 20 at the junction with the emitter 12 as illustrated, the electron 14 transits the barrier 20 to the collector 18. Otherwise, the electron 14 remains confined to the emitter 12. In the illustration, the electrons 14 have sufficient energy to propagate across the barrier 20 and to cross over into the collector 18. The emitter 12 and barrier 20 are sufficiently thin so that the electrons 14 remain energetic enough to transit the device without substantial loss of energy.

The arrangement of FIG. 1 preferably employs materials having selected properties for establishing the relative energy levels illustrated in FIG. 2. In FIG. 2, the emitter 12 and the collector 18 are the same conductivity type, namely n-doped materials. As shown, the Fermi level or equilibrium state for the material is close to the conduction band in both layers. The bias $V_{ce}$ drives the collector 18 more positive. This causes the distortion in the Fermi level, as shown, which allows the electron 14 to transit the barrier 20 with greater relative energy. Thus, when the emitter 12 and collector 18 have the same conductivity type (e.g. n-type or p-type), $V_{ce}$ bias is preferred.

Referring now to FIG. 2A, an unbiased embodiment is shown. The emitter 12 is a p-doped material and the collector 18 is n-doped. The Fermi level is close to the valence band in the emitter 12, and the Fermi level is close to the conduction band in the collector 18. In this arrangement, there is a tendency for the electrons 14 to transit the barrier 20 in the direction of the collector 18 because of the electric field across the barrier 20. Accordingly, a bias voltage is not required.

Referring back to FIG. 1, in the biased embodiment, the photon 16 is incident on the upper exposed surface 26 of the emitter layer 12. In such an arrangement, the band gap of the barrier 20 is selected to be higher than the band gap of the emitter 12 so that only carriers 14 with sufficient energy cross over the barrier 20 into the collector 18.

It is also possible to employ a device which is back illuminated, that is, the device is illuminated from the collector side. In such a device (not shown), the substrate 24, the collector 18 and the barrier 20 are sufficiently transparent to the light 16 so that absorption takes place in the emitter 12. This occurs because the absorption coefficient of each layer overlying the back side of the emitter 12 is relatively low, rendering it essentially transparent to the light. In such a back illuminated device, in contrast to the device of FIG. 1, the band gap of the intermediate layers must be selected to be higher than the emitter 12 so that absorption occurs only in the emitter 12.

Figure 3:
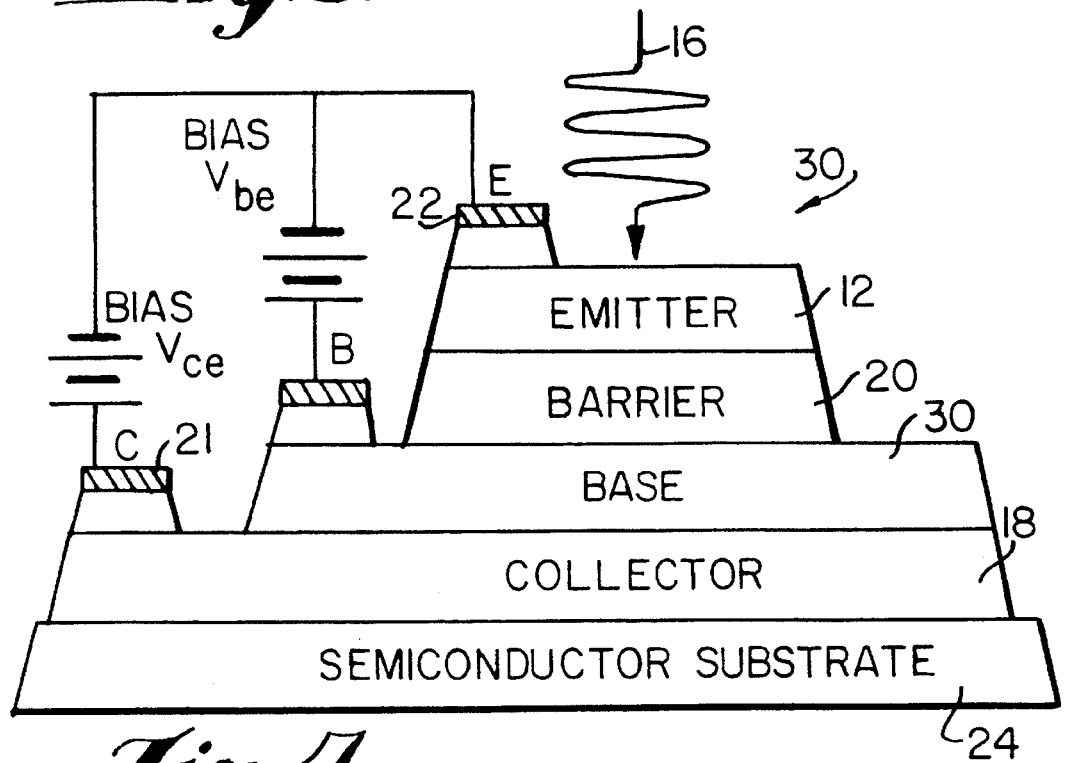
FIG. 3 is a schematic side sectional elevation of a three terminal photodetector in accordance with the present invention.

Referring now to FIG. 3, an alternative embodiment of the invention in the form of an electrically biased three terminal device 30 is shown. Similar elements have the same reference numerals as shown in FIG. 1. The device 30 employs an additional semiconducting base layer or base 32 between the barrier 20 and the collector 18. In addition to the emitter-collector bias $V_{ce}$, a base-emitter bias voltage $V_{be}$ is provided which allows the electric fields in the barrier 20 and the collector 18 to be varied independently. By varying the base-emitter voltage $V_{be}$, changes in the transparency of the barrier-base interface may be affected. The variation in $V_{be}$ may be employed to control or gate the magnitude of the photocurrent which is allowed to pass to the collector 18, or the variation in $V_{be}$ may be employed to change the sensitivity to the wavelength of incident light. One application of such a device is the mixing of an electrical signal applied to the base 30 with an incident optical signal 16. Also, because frequency is directly proportional to energy, the device may be used as an adjustable wavelength discriminator for the incoming optical signal 16.

Figure 4:
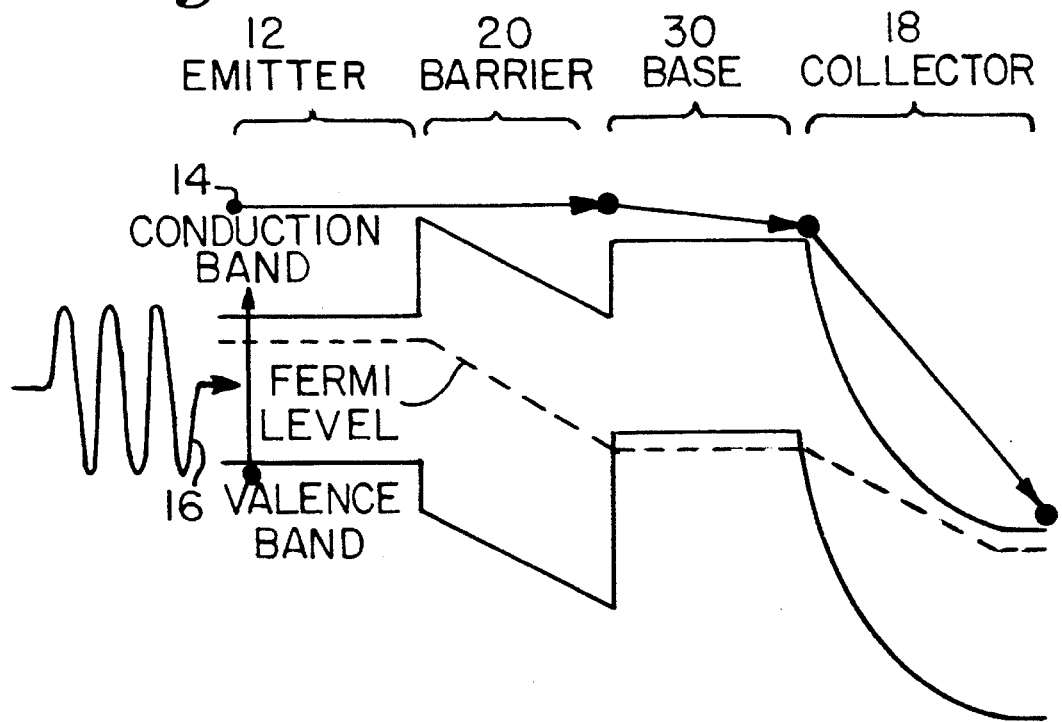
FIG. 4 is an energy diagram illustrating the energy levels of the layers of the device illustrated in FIG. 3.

As illustrated in FIG. 4, the base-emitter voltage $V_{be}$ may be varied so as to block photoexcited electrons 14 by raising the conduction band in the base layer 30. Thus, even though the photoexcited carrier 14 exceeds the conduction band of the emitter 12, any photoconductor having an energy less than the base layer 30 may be blocked. Thus, only photoexcited electrons having an energy greater than the energy difference between the valence band of the emitter 12 and the conduction band of the base 30 or collector 18, whichever is higher, above that established by the base-emitter voltage $V_{be}$ may pass to the collector.

It is also possible to vary the collector-emitter voltage $V_{ce}$ in order to increase the response or speed of the device. If the field in the collector 18 is sufficiently high, carriers can gain enough energy to create more carriers by avalanche multiplication. Thus, the device may be operated to exhibit gain.

In accordance with the invention, the band gap of the emitter 12 may be made small enough for efficient carrier generation. Also, a small band gap usually provides high electron mobility which is desirable in such a device.

However, the low band gap may result in high dark current. In the present invention, thermally generated carriers in the emitter 12 are prevented from traversing the device by means of a barrier layer 28. Thus, such thermally generated carriers do not contribute to a dark current component. The emitter layer 12 also must be sufficiently thin so that photogenerated electrons do not lose energy at the barrier interface.

An exemplary device is described below. The emitter 12 may consist of an approximately 180 nanometer(nm)-thick n-doped layer of $In_xA_{1-x}Sb$ alloy, with the composition chosen to be lattice-matched to an InP substrate. The following properties in Table I are estimates:

TABLE I $\Delta E$ - Energy gap $E_g \sim 0.33$ electron Volts (eV);
Diffusion coefficient $D_e \sim 360$ cm$^2$/s;
Optical absorption coefficient $\alpha \sim 8 \times 10^4$ cm$^{-1}$ at 1550 nm.

With these properties photogenerated carriers are estimated to diffuse from the emitter into the barrier in less than one psec. The diffusion coefficient of the highly energetic photogenerated electrons should be much higher than the value given for $D_e$, but the value chosen, an estimated value for electrons at the bottom of the conduction band, is a conservative value. The emitter material should not possess a low-mobility satellite valley into which the photogenerated electrons can transfer.

The barrier 20 consists of a layer of undoped $In_xGa_{1-x}As_yP_{1-y}$, with the composition chosen to be lattice-matched to an InP substrate and to have a band gap of ~0.9 eV, chosen so that the energy difference between the top of the valence band of the emitter 12 and the bottom of the conduction band of the barrier 20 at the junction with the emitter 12 is at most 0.8 eV, the photon energy of incident 1550-nm light 16, and will produce a photocurrent in response to the incident light 16. The barrier 20 thickness is chosen so that electrons will traverse it without significant energy loss while minimizing device capacitance. A thickness of about 100 nm allows electrons with an estimated peak velocity of 2.5–10$^7$cm/s to traverse the barrier in about 0.4 psec.

In a preferred embodiment, the collector 18 comprises a heavily-doped n-type layer of a semiconductor lattice-matched to InP. In accordance with common photodetector design practice, reverse hole currents are minimized by choosing the band gap characteristics of the collector so that its valence band-edge energy is higher than that of the barrier. The width of the collector 18 is chosen to minimize device capacitance. If a zero bias arrangement is desired, the collector may be an opposite conductivity-type (p-doped) material, as noted above. Other collector characteristics are not critical to device operation.

Other components of the detector are designed in accordance with accepted photodetector design practice. Emitter and collector contact layers, for example, are designed to minimize the series resistance of the device and to allow the maximum possible amount of incident light to reach the active regions.

Device speed $\tau$ is approximately determined by the relationship $\tau \approx \tau_D\tau_T + (R_c+R_e) \cdot C_{ec}$, where $\tau_D$ and $\tau_T$ are the diffusion and transit times, $R_c$ is the circuit impedance, e.g., 50 ohms, $R_e$ is the emitter series resistance, and $C_{ec}$ is the emitter-collector capacitance. Devices are made with small cross-sections to minimize capacitance, and the barrier width is made as large as possible for the same reason. Practical dimensions are a ~10 micrometer($\mu$m)$^2$ cross-section and a ~100-nm barrier thickness, for a capacitance of ~0.01 picoFarads(pF) and an RC time constant of 0.6 psec. The estimated device speed is between 1 and 2 picoseconds, ignoring external circuit parasitics, corresponding to a bandwidth between 250 and 500 GHz. An internal quantum efficiency of about 75% represents the proportion of electrons absorbed by the emitter.

In Table II, each layer is identified by material, thickness, band gap as appropriate, efficiency and bandwidth.

TABLE II

| | |
|---|---|
| EMITTER 12 - | 100 nm thick $InAs_zSb_{1-z}$ lattice matched to InP thickness ~ 100 nm |
| BARRIER 20 - | 100 nm thick - $In_xGa_{1-x}As_yP_{1-y}$ Band gap $\Delta E$ (Eg) ≈ 0.9 eV lattice matched to InP |
| COLLECTOR 18 - | 1000 nm thick - $InAs_zSb_{1-z}$, lattice matched to InP |

The example illustrates a practical expedient to implement the invention. However, it should be understood that variations may be made which will allow for different operating characteristics. For example, it may be desirable to increase the efficiency of the device where light levels are reduced. However, the device may then have a slower response time. Similarly, if increased speed is desirable, a lower acceptable efficiency may be required.

The present invention may be manufactured at relatively low cost and have an efficiency near 90% with a bandwidth of about 200 GHz. At lower efficiencies, the bandwidth may be increased to about 500 GHz.

In accordance with the present invention, the emitter layer 12 may have a thickness in the range of about 5 to about 500 nm. Preferably, the emitter 12 has a thickness in a range of about 30 to about 300 nm, and more preferably in a range of about 50 to about 150 nm. As the emitter thickness increases, the efficiency increases and the frequency response or bandwidth decreases.

Alternatively, the emitter 12 or the collector 18 or both, have a thickness at least 50 nm. As a result, the invention is operative as a detector at short wavelengths, in particular, wavelengths no longer than about 3000 nm. Furthermore, the invention features a single layer of each type material, which is doped differently to achieve short wavelength detection.

The band gap of the emitter layer 12 may also be varied by selecting various materials in accordance with the desired application of the device. For example, devices in accordance with the present invention have a band gap up to about 6 electron volts. Although a higher band gap is theoretically possible, as a practical matter, applications contemplated use an emitter layer 12 with a band gap lower than 3 eV. In a preferred embodiment, the band gap is in a range useful for communications applications of about 0.18 eV to about 1.5 eV.

In the invention, the materials employed for the various layers are selected so as to exhibit desired properties. Preferably, semiconductors are employed, because semiconductors have a higher mobility than metals and this results in a faster device. For example, optical detectors utilizing the teachings of the invention can active a response time of less than about 1 psec and may be used at 200 GHz. In an exemplary embodiment, the emitter layer 12 is an n-type material which may be doped in the range of about $10^{16}$ carriers/cm$^3$ to about $10^{20}$ carriers/cm$^3$. In an n-type emitter 12, electrons are the majority carrier, and traverse the semiconductor layers faster than if holes were the majority carrier. Such faster speed results in higher mobility and faster response. When a fast response is desired, it is useful to provide a doping level at the lower end of the above-mentioned range. Although it is theoretically possible to achieve a dopant level of $10^{20}$ carriers/cm$^3$, dopant levels on the order of $10^{18}$–$10^{19}$ carriers/cm$^3$ cause electron mobility to be significantly reduced. However, the dopant levels are preferably as high as is feasible consistent with maintaining sufficiently high mobility, because mobility decreases with increasing dopant levels.

The barrier layer 20 may contain lower dopant levels than the emitter layer 12. For convenience, the emitter 12 may be lightly doped and the barrier 20 may be undoped.

In a preferred embodiment, the emitter 12 is an n-type material, and the collector 18 is a p-type material. Alternatively, the collector 18 may be an n-doped material. In this case the dopant level is near the high end of the range, to provide for higher conduction efficiency. When employed, the base layer 30 may be a p-doped material. The dopant level is selected to be compatible with the gating function of the base.

In order to further reduce potential noise sources, such as trapped thermal conduction band electrons at the barrier-emitter interferences, a graded semiconductor band gap may be employed. In such an arrangement, a graded band gap layer comprising semiconductors with band gaps intermediate between those of the emitter 12 and the barrier 20 may be employed. Grading may also be achieved by varying the dopant level at the interface.

In accordance with the invention, semiconductor materials useful for each of the various layers are known in the art. The emitter 12 may be a semiconductor material selected for low-band gap properties in the range of about 0.18 to about 1.5 eV. Also, the semiconductors need not be exclusively of a single composition, e.g., GaN, but may be different compositions tailored for speed, efficiency and noise suppression.

In accordance with the invention, the photodetector has a broad band response in a relatively simple and inexpensive design employing known materials tailored to specific response characteristics. In particular, the invention is operative in the communication based infrared(IR) to ultraviolet(UV) wavelengths. The emitter 12 is a semiconductor material having a band gap which is low with respect to the energy of the light to be detected. The height of the barrier 20 with respect to the emitter 12 may be adjusted so as to selectively eliminate thermally generated charge carriers and allow photoexcited electrons to conduct to the collector with relatively little noise.

While there have been described what are at present considered to be the preferred embodiments of the present invention, it will be apparent to those skilled in the art that various changes and modifications may be made therein without departing from the invention, and it is intended in the appended claims to cover such changes and modifications as fall within the spirit and scope of the invention.

What is claimed is:

1. An optical detector comprising:
   a low band gap semiconductor emitter layer for producing a photogenerated charge upon absorption of light the photogenerated charge being produced by interband transition of an electron from the emitter layer valence band to the emitter layer conduction band, the photogenerated charge being produced with sufficient energy to transit said emitter layer;

(b) a semiconductor collector layer for collecting the photogenerated charge; and (c) a semiconductor barrier layer disposed between said emitter layer and said collector layer, said barrier layer having a conduction band and being for blocking from transit from said emitter layer to said collector layer substantially all charge but charge in the barrier layer conduction band having energy in excess of a threshold energy, said barrier layer also being for passing from said emitter layer to said collector layer by charge transport charge in the barrier layer conduction band having energy in excess of the threshold energy.

2. The optical detector of claim 1 further comprising a junction between said emitter layer and said barrier layer, wherein the threshold energy is the energy difference between the energy level of the edge of the conduction band in said barrier layer at said junction, and the energy level of the edge of the valence band in said emitter layer.

3. The optical detector of claim 1 wherein said collector layer has a band gap greater than the band gap of said emitter layer.

4. The optical detector of claim 1 wherein said emitter layer has a thickness ranging from about 5 to about 500 nm.

5. The optical detector of claim 1 wherein said emitter layer has a band gap up to about 3 eV.

6. The optical detector of claim 1 wherein said emitter layer is doped up to a level between $10^{16}$ and $10^{19}$ carriers/cm$^3$.

7. The optical detector of claim 1 wherein the band gap of said emitter layer is between about 0.15 and 1.5 eV for absorbing light having wavelengths in the communications band.

8. The optical detector of claim 1 further comprising biasing means between said emitter layer and collector layer for attracting photogenerated charge to said collector layer.

9. The optical detector of claim 1 further comprising a semiconductor base layer disposed between said collector layer and said barrier layer, said base layer being for controlling the amount of photogenerated charge carried to said collector.

10. The optical detector of claim 9 further comprising biasing means for establishing a potential between said base layer and said emitter layer for regulating flow of photogenerated charge to said collector layer.

11. The optical detector of claim 1 wherein said emitter layer is a material having a band gap which is up to about one half the energy of a single photon of incident light.

12. The optical detector of claim 1 wherein the absorption coefficient of said emitter is at least $10^4$/cm.

13. The optical detector of claim 1 wherein the band gap of said barrier is greater than the band gap of said emitter.

14. The optical detector of claim 1 further comprising a substrate for supporting said collector layer.

15. The optical detector of claim 14 wherein said substrate is a semiconductor.

16. The optical detector of claim 10 wherein said emitter layer, said base layer and said collector layer each include contact means for receiving a biasing potential.

17. An optical detector of claim 1 wherein said barrier layer suppresses dark current between said emitter and collector layers.

18. The optical detector of claim 17 wherein the dark current is generated by thermally generated carriers.

19. The optical detector of claim 1 Wherein said emitter layer comprises an $As_ySb_{1-y}$ material having a lattice matched to InP.

20. The optical detector of claim 1 wherein said barrier layer comprises $In_xGa_{1-x}As_yP_{31-y}$ having a band gap energy of about 0.9 eV.

21. The optical detector of claim 1 wherein said collector layer comprises an $As_zSb_{1-z}$ material lattice matched to InP.

22. The optical detector of claim 1 wherein said emitter layer, said collector layer and said barrier layer are each about 100 nm thick.

23. The optical detector of claim 1 wherein said collector layer and barrier layer are transparent to the absorbed light.

24. The optical detector of claim 1 wherein said emitter layer and said collector layer each comprise a semiconductor of the same conductivity type.

25. The optical detector of claim 1 wherein said barrier and said emitter layer each comprise a semiconductor of the same conductivity type.

26. The optical detector of claim 1 wherein said emitter layer and said collector layer are semiconductors of differing conductivity types.

27. The optical detector of claim 1 having a response time of about 1 psec.

28. The optical detector of claim 1 having speed of operation of about 200 GHz.

29. The optical detector of claim 1 further comprising a graded interface between said barrier layer and said emitter layer.

30. The optical detector of claim 29 wherein said barrier layer and said emitter layer comprise semiconductor materials having a graded dopant level at said interface.

31. The optical detector of claim 1 wherein said emitter layer is sufficiently thin so that the photogenerated charge exits said emitter layer with substantially the same energy it had upon being photogenerated.

32. A method for detecting light comprising the steps of:
   (a) producing a photogenerated charge upon absorption of light by a low band gap semiconductor emitter layer, said producing being by interband transition of an electron from the emitter layer valence band to the emitter layer conduction band, the photogenerated charge being produced with sufficient kinetic energy to transit the emitter layer;
   (b) collecting the photogenerated charge by a semiconductor collector layer;
   (c) blocking from transit from the emitter layer to the collector layer substantially all charge but charge in a barrier layer conduction band having energy in excess of a threshold energy, said blocking being by a semiconductor barrier layer disposed between the emitter layer and the collector layer; and
   (d) passing from the emitter layer to the collector layer by charge transport charge in the barrier layer conduction band having energy in excess of the threshold energy, said passing being by the semiconductor barrier layer.

* * * * *